(12) United States Patent
Okamura

(10) Patent No.: US 6,452,824 B1
(45) Date of Patent: *Sep. 17, 2002

(54) SEMICONDUCTOR MEMORY DEVICE

(75) Inventor: Jun-ichi Okamura, South Burlington, VT (US)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/518,542

(22) Filed: Mar. 3, 2000

Related U.S. Application Data

(63) Continuation of application No. 09/061,058, filed on Apr. 16, 1998, now Pat. No. 6,084,816.

(51) Int. Cl.⁷ .............................. G11C 5/02; G11C 7/00
(52) U.S. Cl. ........................... 365/51; 365/63; 365/207
(58) Field of Search ............................. 365/51, 63, 207

(56) References Cited

U.S. PATENT DOCUMENTS

| | | | |
|---|---|---|---|
| RE33,694 E | 9/1991 | McElroy | 365/149 |
| 5,097,440 A | 3/1992 | Konishi et al. | 365/51 |
| 5,253,203 A | 10/1993 | Partovi et al. | 365/189.02 |
| 5,255,231 A | 10/1993 | Oh | 365/214 |
| 5,276,650 A | 1/1994 | Kubota | 365/207 |
| 5,327,375 A | 7/1994 | Harari | 365/149 |
| 5,357,478 A | 10/1994 | Kikuda et al. | 365/230.03 |
| 5,513,142 A | 4/1996 | Arimoto et al. | 365/189.11 |
| 5,544,113 A | 8/1996 | Kirihita et al. | 365/230.03 |
| 5,546,349 A * | 8/1996 | Watanabe et al. | 365/63 |
| 5,586,078 A | 12/1996 | Takase et al. | 365/230.03 |
| 5,636,158 A * | 6/1997 | Kato et al. | 365/63 |
| 5,671,188 A | 9/1997 | Patel et al. | 365/205 |
| 5,822,268 A | 10/1998 | Kirihita | 365/230.03 |
| 6,249,451 B1 * | 6/2001 | Okamura | 365/63 |

* cited by examiner

Primary Examiner—Trong Phan
(74) Attorney, Agent, or Firm—Banner & Witcoff, Ltd.

(57) ABSTRACT

A semiconductor memory device includes a memory cell array having memory cells arranged in rows and columns. Bit lines are coupled to the memory cells in corresponding columns and word lines are arranged to be substantially orthogonal to the bit lines, each word line coupled to the memory cells in a corresponding row. The memory cell array is divided into an odd number of sub-arrays which are spaced apart from each other in the word line direction. No bit lines and no memory cells are formed in the spaces between the sub-arrays.

2 Claims, 12 Drawing Sheets

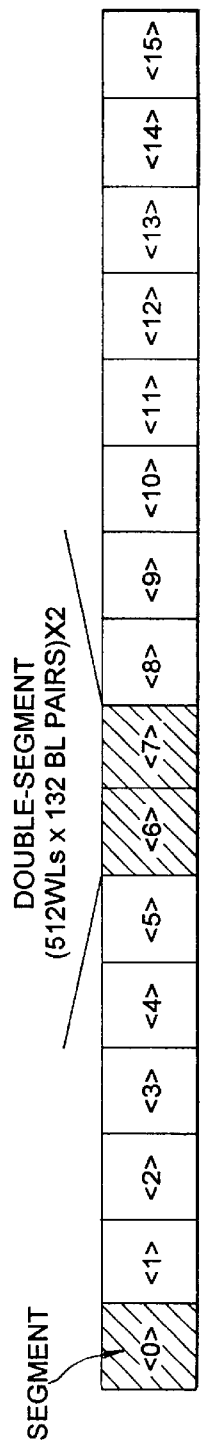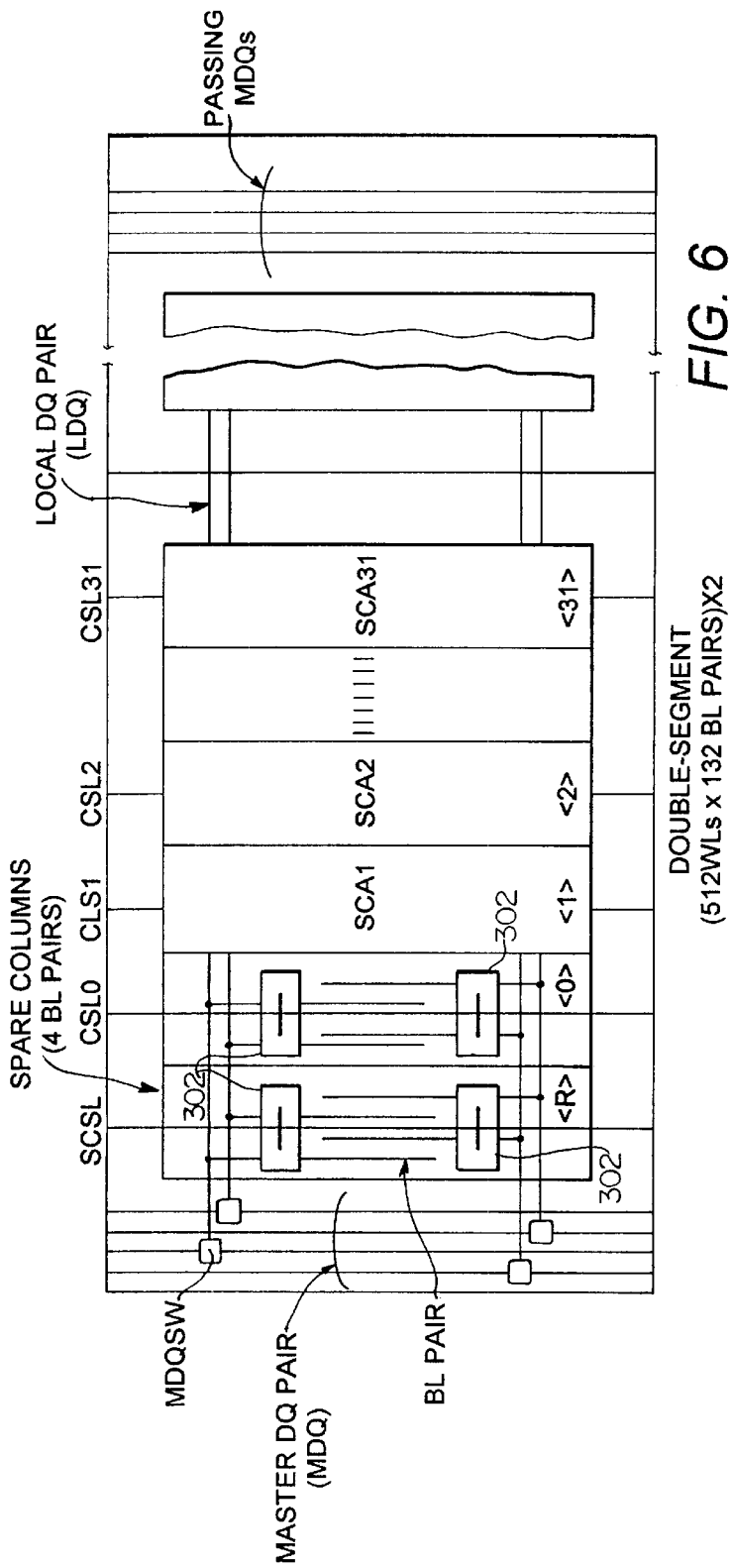

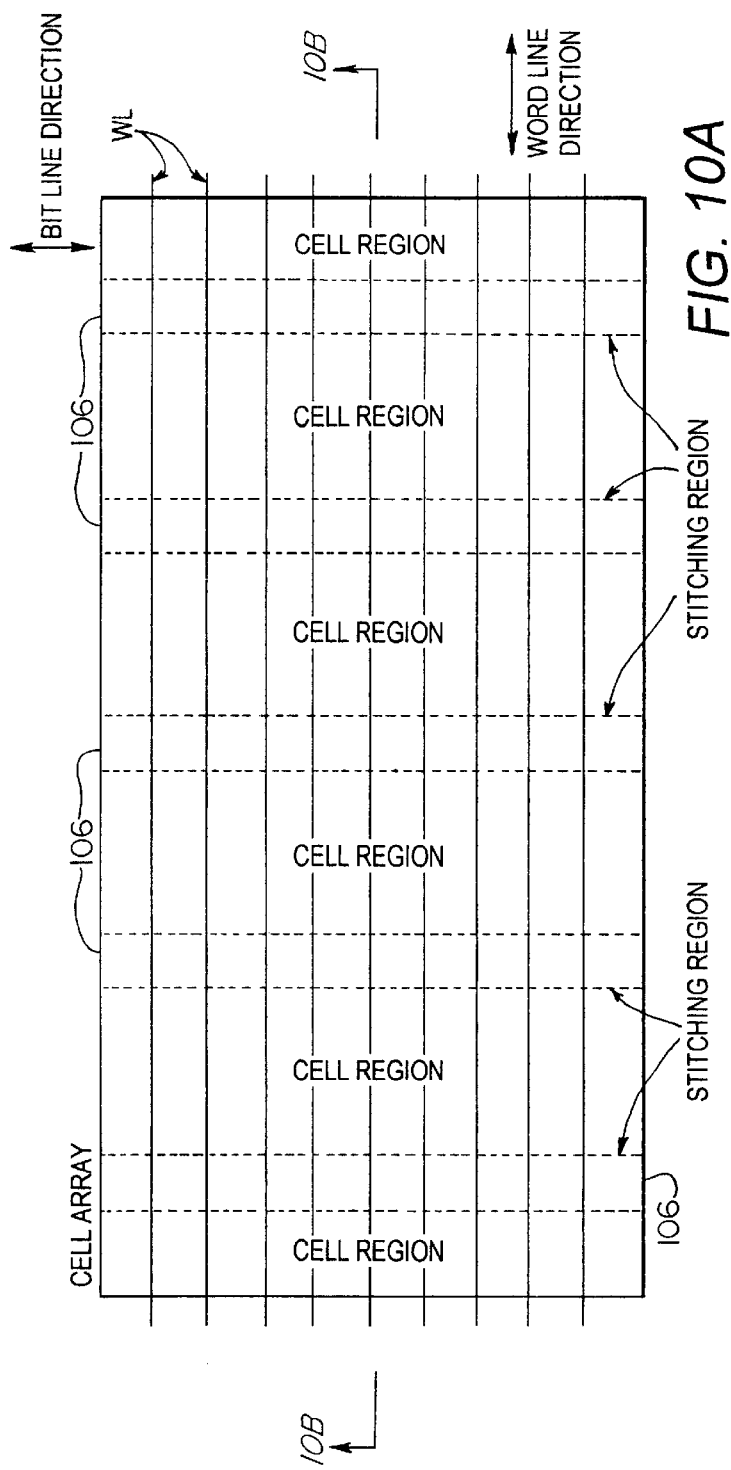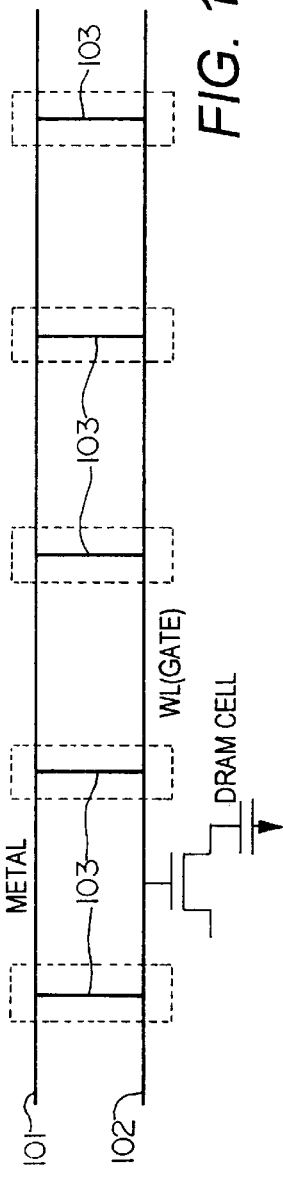

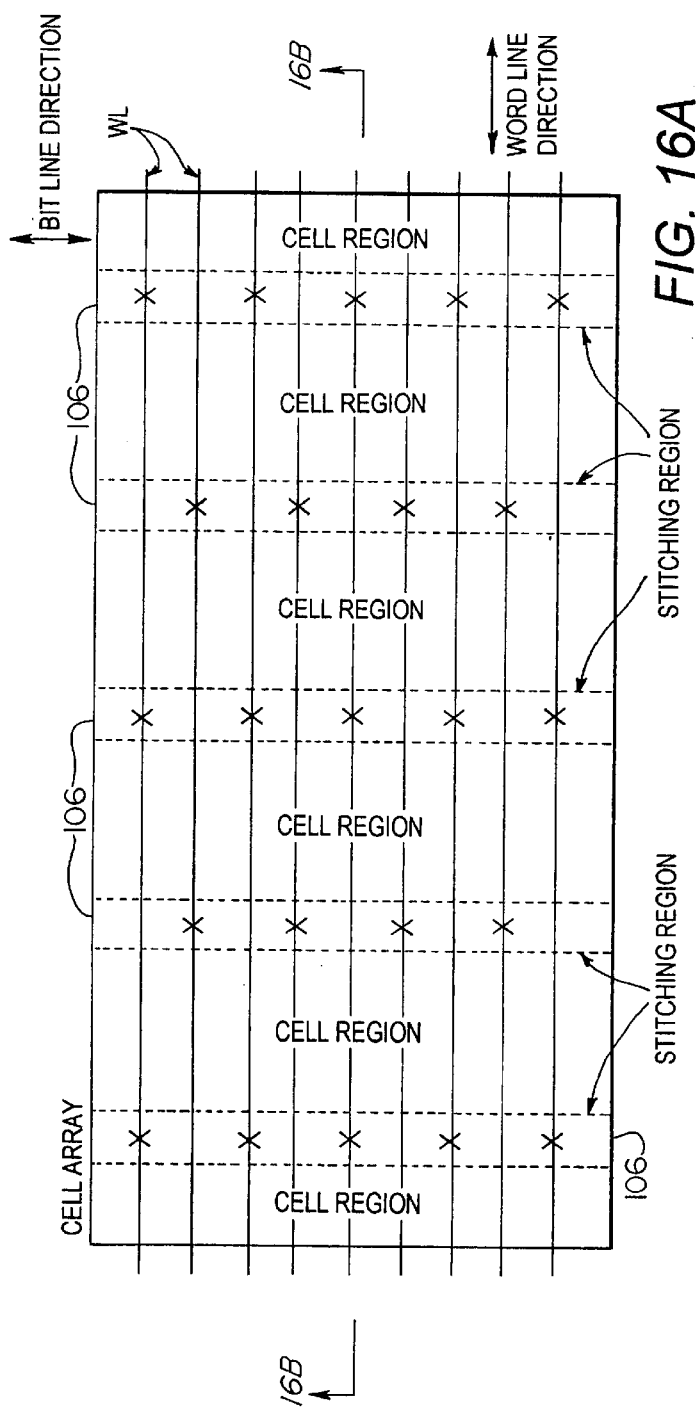
FIG. 16A
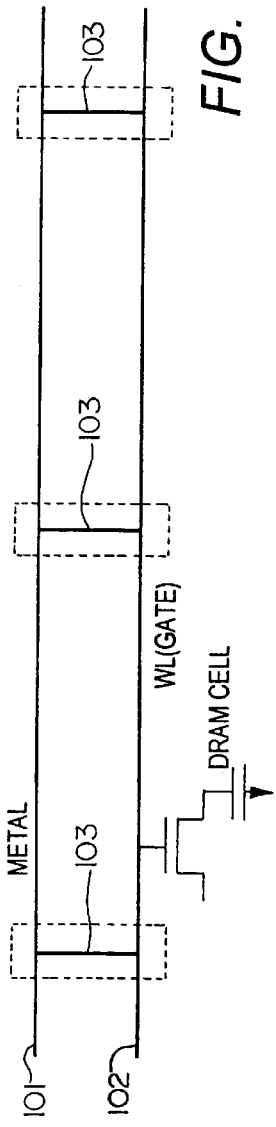
FIG. 16B
FIG. 15

US 6,452,824 B1

SEMICONDUCTOR MEMORY DEVICE

This application is a Continuation of U.S. application Ser. No. 09/061,058, filed on Apr. 16, 1998, which is now U.S. Pat. No 6,084,816.

TECHNICAL FIELD

The present invention is generally related to a semiconductor memory device and, more particularly, to a layout arrangement of a dynamic random access memory (DRAM).

BACKGROUND OF THE INVENTION

The demand for higher integration density semiconductor memory devices has necessitated progressively denser patterns of bit lines, word lines, sense amplifiers, etc. This progression is shown in FIGS. 1A–1C. FIG. 1A is a schematic representation of an early generation DRAM architecture (e.g., 256 kbits to 4 Mbits) and shows memory cell arrays 10 which include memory cells (not shown) connected to bit lines BL. The bit lines BL of memory cell arrays 10 are connected to sense amplifiers 14 and the sense amplifiers are selectively coupled to I/O data lines (e.g., by a column selection signal applied to column switches) for inputting and outputting data. FIG. 1B is a schematic representation of a later generation DRAM architecture (e.g., 16 Mbits) and shows a plurality of memory cell arrays 20. Each of the memory cell arrays 20 includes memory cells (not shown) connected to bit lines BL. The bit lines BL of the memory cell arrays 20 are connected to sense amplifiers which are in turn selectively connectable to local data lines (LDQs). For clarity, the sense amplifiers are not shown in FIG. 1B. The sense amplifiers may be selectively connected to the LDQs via column switches responsive to column selection signals. The LDQs are selectively coupled to master data lines (MDQs) via switches 22. FIG. 1C is a schematic representation of a still later generation DRAM architecture (e.g., 64 Mbits and beyond) and shows a plurality of memory cell arrays 30. Each of the memory cell arrays 30 includes memory cells connected to bit lines. For purposes of clarity, the memory cells and bit lines are not shown in FIG. 1C. As in the DRAM architecture of FIG. 1B, the bit lines of the memory cell arrays are coupled to sense amplifiers (not shown), the sense amplifiers are selectively connectable to the LDQs, and the LDQs are selectively connectable to the MDQs via switches 22. The MDQs of FIG. 1C are arranged to cross over the memory cell arrays 30 as compared to the MDQs of FIG. 1B which are arranged at the periphery of the memory cell arrays. The architecture of FIG. 1C can be efficiently applied to highly integrated DRAMs since a wide data path formed to overlay the memory cell arrays requires less "real estate" than a wide data path formed at the periphery of the memory cell arrays as in FIG. 1B. In addition, the architecture of FIG. 1C is advantageous over that of FIG. 1B since routing a wide data line path to the periphery of the memory cell arrays as in the architecture of FIG. 1B increases wiring capacitance and access time.

FIG. 2 is a detailed block diagram representation of the architecture of FIG. 1C and illustrates that the memory cell arrays 30 include bit lines and word lines arranged to cross the bit lines. The bit lines are connected to sense amplifiers designated as "S/A". Column selection signals control switches (not shown in FIG. 2) for selectively connecting the sense amplifiers S/A to the LDQs (LDQ and /LDQ in FIG. 2). The LDQs are connected to the MDQs (MDQ and MDQ in FIG. 2) via switches MDQSW. The physical layout of a DRAM having an architecture such as the architecture of FIG. 2 (or some other similar architecture) should provide for convenient connections between the LDQs and the MDQs and result in a data path which is organized for the efficient input/output of data to/from the memory device. In addition, the physical layout must provide spaces within which to implement the MDQSWs for connecting the LDQs and the MDQs. It is desirable that the provision of spaces for the MDQSWs does not result in an increase in the size of the area required to lay out the sense amplifiers. Since sense amplifiers are highly repeated structures in a semiconductor memory device, even the requirement of a slight increase in the size of the area for laying out the sense amplifiers can result in an undesirable increase in the size of the memory device. One layout design which provides space for the placement of the MDQSWs is described in U.S. Pat. No. 5,636,158, the contents of which are incorporated herein by reference in their entirety. In the '158 patent, bit line portions between adjacent memory cell arrays are bent as shown in FIG. 3 to provide a space between a pair of sense amplifiers. The MDQSWs and other sparse devices may be placed in this space. However, the bending of the bit lines to form the switch region shown in FIG. 3 results in certain limitations in the degree to which the spacing "S" between the adjacent cell arrays can be shrunk. In addition, the slanting or bending of the bit line portions can result in difficulties in the lithography and etching processes used in manufacturing the memory device. For example, slanted or bent features are more difficult to process than straight features using the current state-of-the-art off-axis illumination techniques for the manufacturing process of 256 Mbit DRAMs. This adversely impacts on the ability to mass produce devices having such slanted or bent features.

Accordingly, it would desirable to provide a layout for a highly integrated semiconductor memory device such as a DRAM which provides, among other things, for convenient connections between local data lines and master data lines, for a data path organized for efficient data input and output and for spaces within which to implement the switches for connecting the LDQs and the MDQs. It would also be desirable to provide such a memory device which may be manufactured using processes well-suited for mass production.

SUMMARY OF THE INVENTION

In accordance with one aspect of the present invention, a semiconductor memory device includes a memory cell array having memory cells arranged in rows and columns. Bit lines are coupled to the memory cells in corresponding columns and word lines are arranged to be substantially orthogonal to the bit lines, each word line coupled to the memory cells in a corresponding row. The memory cell array is divided into an odd number of sub-arrays which are spaced apart from each other in the word line direction. No bit lines and no memory cells are formed in the spaces between the sub-arrays.

In accordance with another aspect of the present invention, a semiconductor memory device includes a memory cell array comprising dynamic random access memory cells arranged in rows and columns. Bit lines are coupled to the memory cells in corresponding columns and word lines extend in a direction substantially orthogonal to the bit lines. Each word line is coupled to the memory cells in a corresponding row. The memory cell array is divided into an odd number of sub-arrays which are spaced apart from each other in the word line direction and no bit lines and no memory cells are formed in the spaces between the sub-arrays. Sense amplifiers are arranged in a sense amplifier layout and coupled to said bit lines and spaces are formed in the sense amplifier layout in correspondence with the spaces between the sub-arrays. First switching transistors are provided for selecting the sense amplifiers to input/output data to/from first data lines and second switching transistors are provided for selectively connecting the first data lines to second data lines. The second switching transistors are arranged in the spaces in the sense amplifier layout.

The number and positioning of the spaces between the sub-arrays of the semiconductor memory device of the present invention are chosen so that a sufficient number of switches (e.g., for a wide I/O DRAM) may be formed to connect the local data lines to master data lines. For example, by dividing the memory cell array into $2^n+1$ sub-arrays (n is equal to greater than one), a total of $2^n$ spaces are provided within which the switches may be formed. Since it is desirable in terms of data input/output to provide $2^n$ master data lines, the present invention provides for a convenient correspondence between the switches formed in the $2^n$ stitch regions and the $2^n$ master data lines.

In addition, the semiconductor memory device of the present invention provides for a homogeneous and repeatable sense amplifier design which is advantageous in terms of the process for manufacturing the semiconductor memory device. Finally, the semiconductor memory device of the present invention permits a shrinking of the sense amplifier width as compared to a semiconductor memory device in which portions of the bit lines are bent or slanted to spaces for switches and other sparse devices.

BRIEF DESCRIPTION OF THE DRAWINGS

The accompanying drawings, which are incorporated in and constitute a part of the specification, illustrate various embodiments of the present invention and, together with the general description given above and the detailed description provided below, serve to explain the principles of the invention.

FIG. 5 is a block diagram showing the 16 segments which together constitute one of the one Mbit blocks of the unit circuit of FIG. 4.

FIG. 6 is a block diagram of the double segment pair of FIG. 5.

FIGS. 10A and 10B are an upper plan view and a cross-sectional view, respectively, showing stitching regions at which a first word line portion is connected to a second word line portion.

FIG. 15 illustrates a way for dividing 64 cell array circuits to provide 4 spaces for switch devices.

FIGS. 16A and 16B are an upper plan view and a cross-sectional view, respectively, showing offset stitch regions for adjacent word lines.

DETAILED DESCRIPTION

Figure 1A:
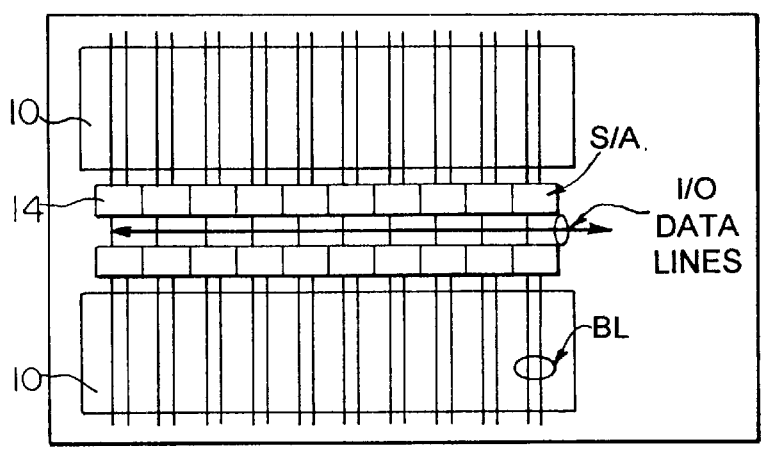
FIGS. 1A, 1B, and 1C are schematic representations of various generations of DRAM architecture.
Figure 1B:
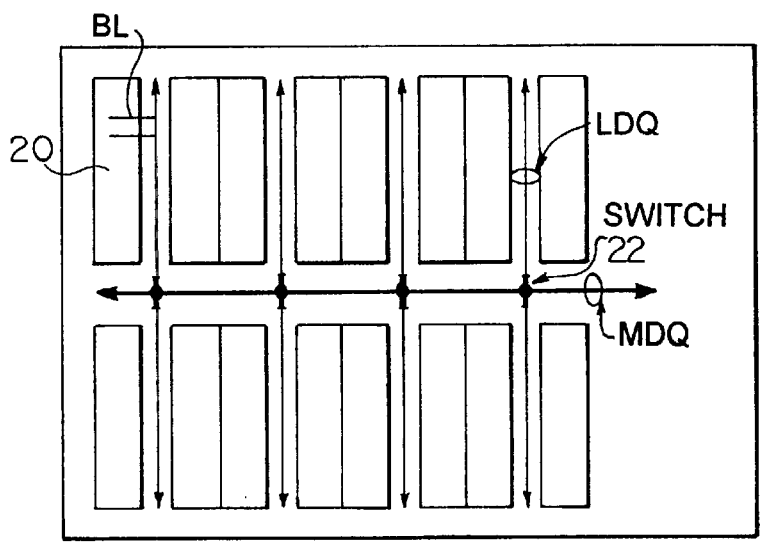
Figure 1C:
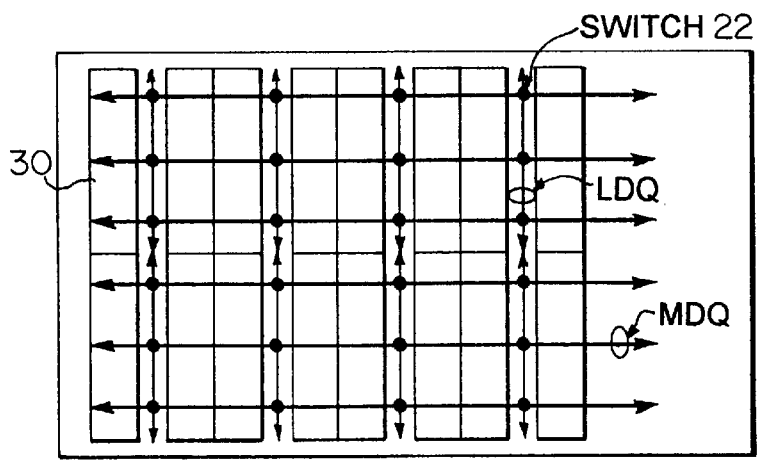
Figure 2:
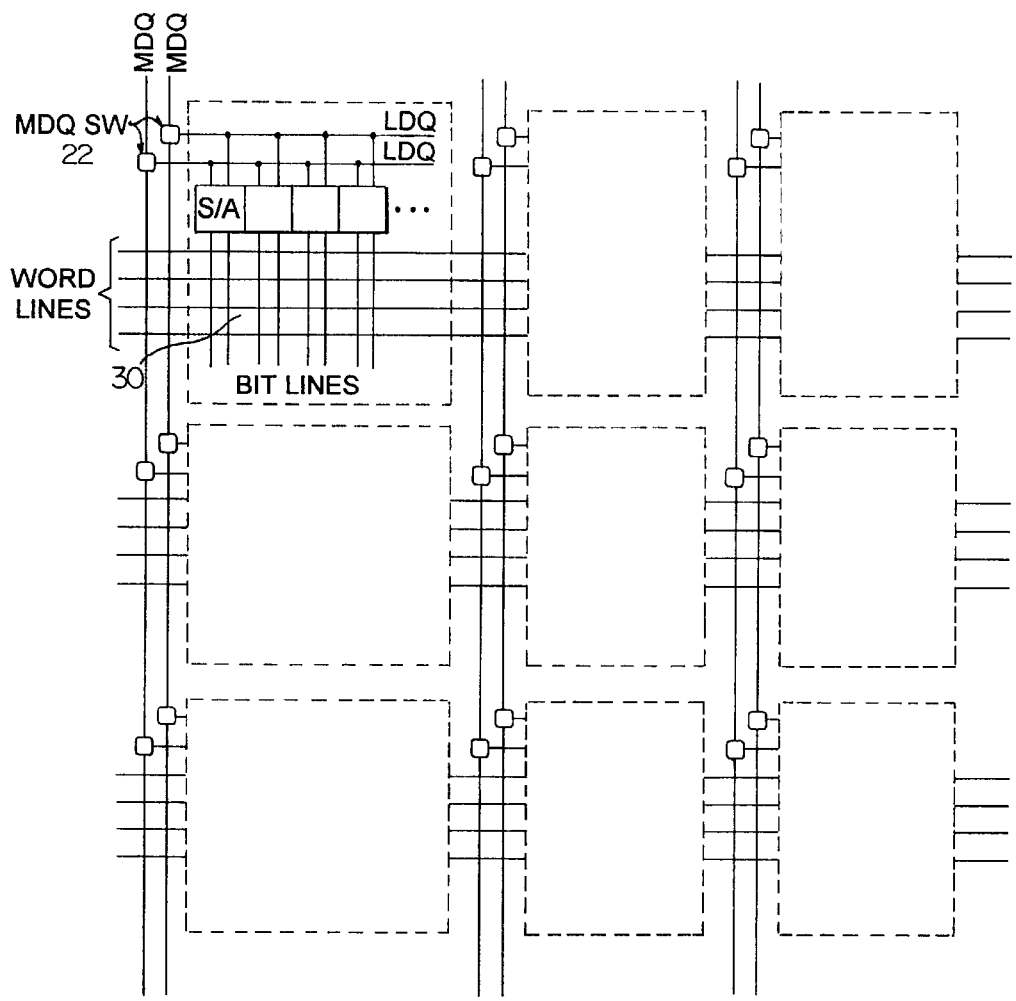
FIG. 2 is a detailed block diagram representation of the DRAM architecture of FIG. 1C.
Figure 3:
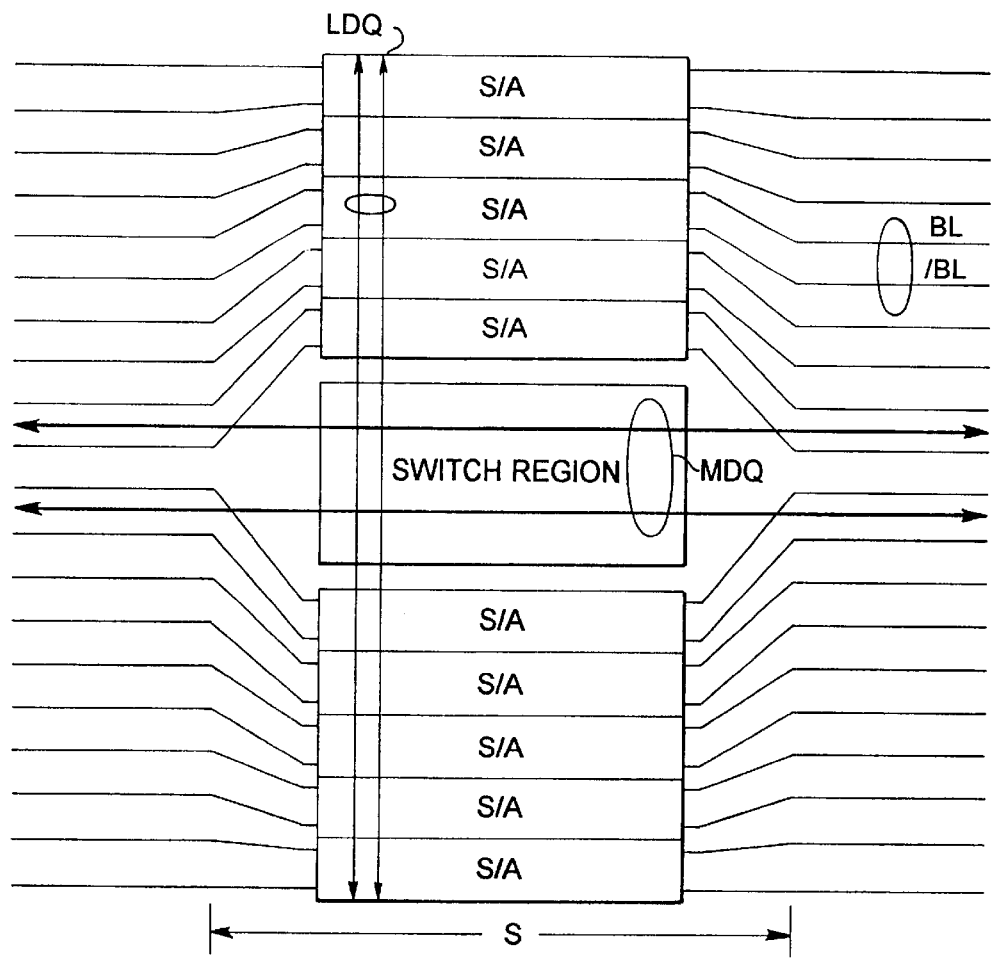
FIG. 3 illustrates a prior art layout which provides spaces for switches for connecting local data lines and master data lines.

The present invention will be described in terms of a DRAM device which is organized in a hierarchical structure. In particular, the present invention will be described in terms of a 256 Mbit DRAM which includes 16 unit circuits, each unit circuit including 16 block circuits, each block circuit including 16 segments, and each segment including 32 (plus a spare) segment cell array circuits. Each unit circuit stores 16 Mbits of data and thus the 16 unit circuits together store 256 Mbits. The memory cells of the DRAM device may comprise trench capacitor DRAM cells as described in the article by Nesbit et al. entitled "A 0.6 $\mu m^2$ 256 Mb Trench DRAM Cell With Self-Aligned BuriEd Strap (BEST)", IEDM Digest of Technical Papers, December 1993, pp. 627–620, the contents of which are incorporated in their entirety herein by reference.

Figure 4:
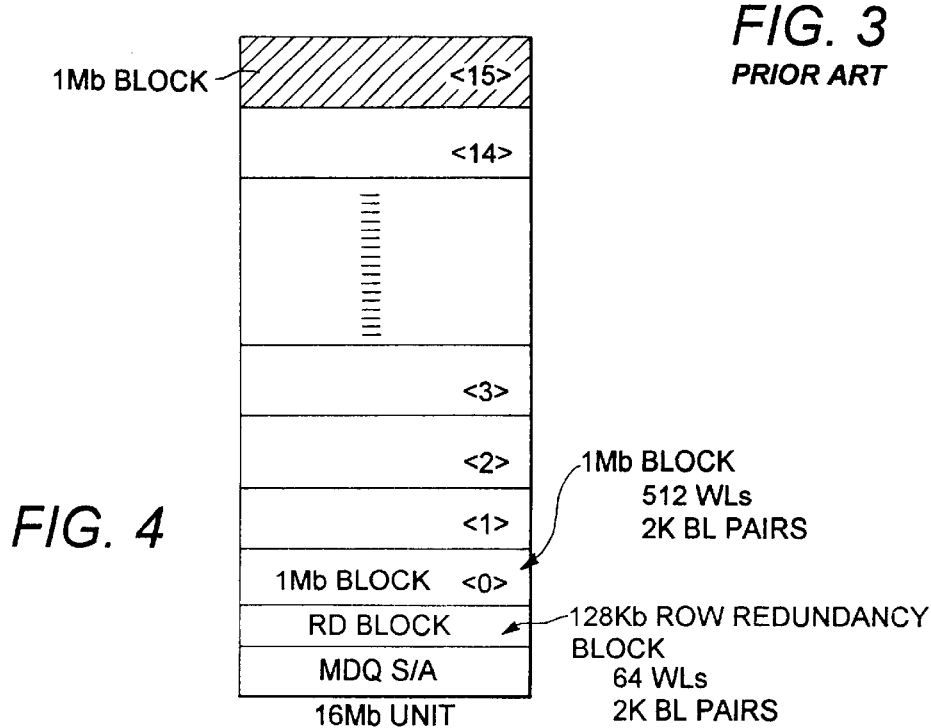
FIG. 4 is a block diagram of one of sixteen unit circuits which together constitute a 256 Mbit DRAM.

FIG. 4 is a block diagram of one of the 16 unit circuits which together constitute the 256 Mbit DRAM. The unit circuit of FIG. 4 includes 16 one (1) Mbit blocks, a redundancy block (e.g., 128 kbits), and a master data bus sense amplifier row MDQ S/A.

FIG. 5 shows that each 1 Mbit block includes 16 segments, the segments being designated in FIG. 5 by the numbers <0>–<15>. Each segment includes memory cell arrays which are organized in terms of 512 word lines and 132 bit line pairs. Of the 132 bit line pairs, four bit line pairs are provided as spare bit line pairs. As shown in FIG. 5, the segments are organized in double-segment pairs.

FIG. 6 is a block diagram of a double segment pair of FIG. 5. A first segment (depicted on the left-hand side of FIG. 6) is illustrated in detail. A second segment, depicted on the right-hand side of FIG. 6, is substantially a mirror image of the first segment. The first segment includes 32 segment cell array circuits, designated as SCA0–SCA31. The first segment also includes a spare cell array circuit. Each cell array circuit is based on an architecture including 512 word lines and four bit line pairs and each cell array circuit stores 2048 bits. Thus, each segment of 32 cell array circuits stores 65,536 bits and provides for 2048 spare bits. Accordingly, each segment pair stores 131,072 bits and provides for 4096 spare bits.

Each segment cell array circuit includes four sense amplifiers 302 and each sense amplifier is selectively connectable to a local data bus designated LDQ. The local data bus extends through each of the segment cell array circuits in both segments of the double segment pair. However, only the segment cell array circuit which is selected by a column select line (e.g., CSL 0 through CSL 31 or spare SCSL) in either segment is permitted to transfer data between local data bus LDQ and the sense amplifiers of the selected segment cell array circuit.

Each double segment pair includes a master data bus having 8 master data lines. It will be appreciated that a data line preferably includes a complementary pair of wires. In the arrangement shown in FIG. 6, four of the master data lines are designated "passing" master data lines and are not connected to any local data lines LDQ of the double segment pair shown in FIG. 6. The other four master data lines are selectively connectable through master data line switches MDQSW to the four local data lines (i.e., LDQs).

In one arrangement, each segment of the sixteen segments in a block (see FIG. 5) includes a set of four master data lines. The set of four master data lines extends through corresponding segments in each block of the sixteen blocks depicted in FIG. 4 and are connected to sense amplifiers in the MDQ S/A row. Additional details regarding data line arrangements may be found in U.S. Pat. No. 5,546,349, the contents of which are incorporated herein in their entirety by reference.

Figure 7:
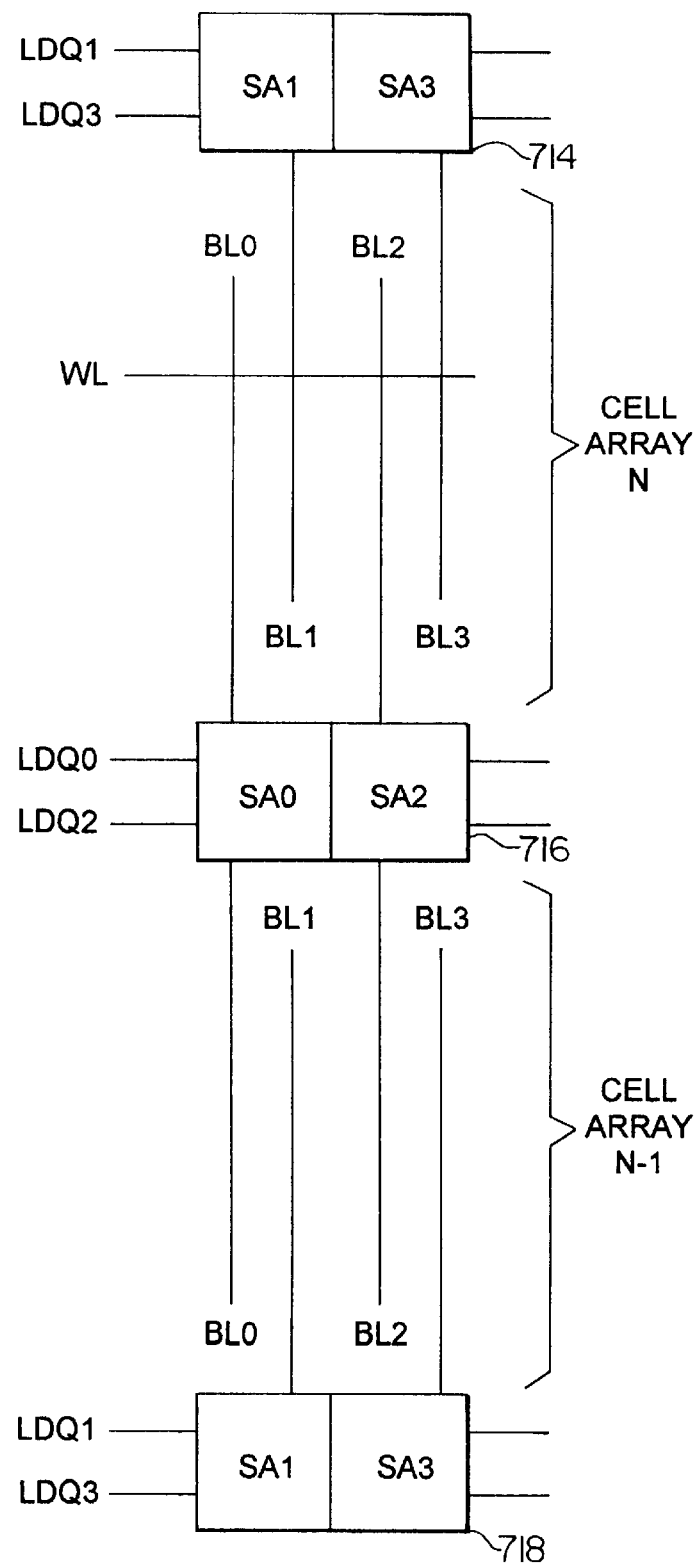
FIG. 7 is a block diagram of a segment cell array circuit with a two-sided sense amplifier row shared between adjacent cell arrays.

FIG. 7 is a block diagram of a portion of a cell array circuit with a two-sided sense amplifier row shared between adjacent cell arrays. Sense amplifiers 302 of FIG. 6 may be constituted by such two-sided sense amplifiers. Sense amplifier row 716 serves both cell array N and cell array N−1; sense amplifier row 714 serves cell array N and cell array N+1 (not shown in FIG. 7); and sense amplifier row 718 serves cell array N−1 and cell array N−2 (not shown in FIG. 7).

Figure 8:
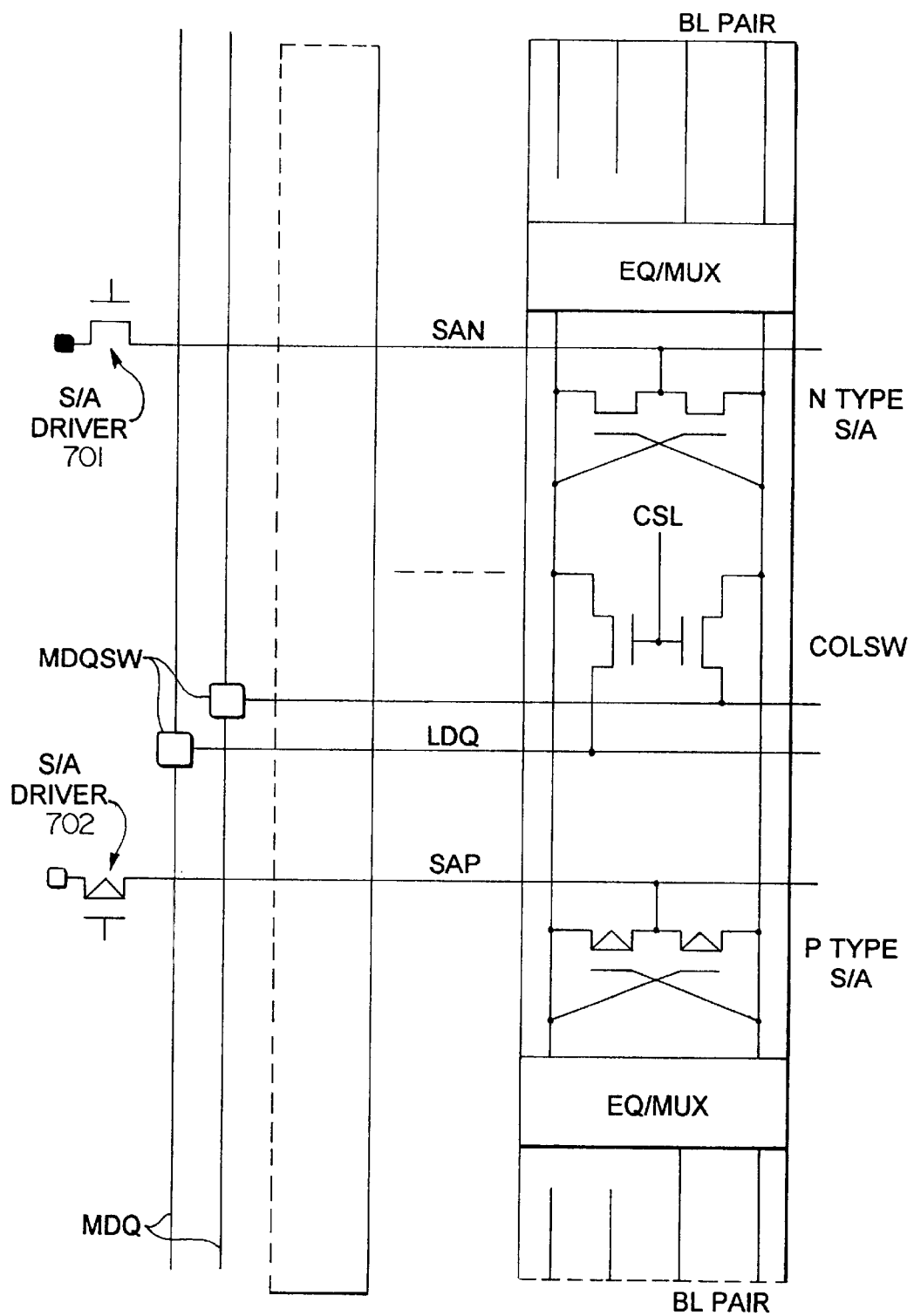
FIG. 8 is a circuit schematic of a two-sided shared sense amplifier.

FIG. 8 is a circuit schematic of a two-sided shared sense amplifier and master data bus switch MDQSW connecting local data line LDQ to master data line MDQ. Local data line LDQ depicted in FIG. 8 is a single line having complementary signal carrying wires. Similarly, master data line MDQ is a single line having complementary signal carrying wires. Master data line switch MDQSW includes two switches, preferably MOS type transistor switches, connecting the respective complementary wires of local data line LDQ to the wires of master data line MDQ.

Figure 9:
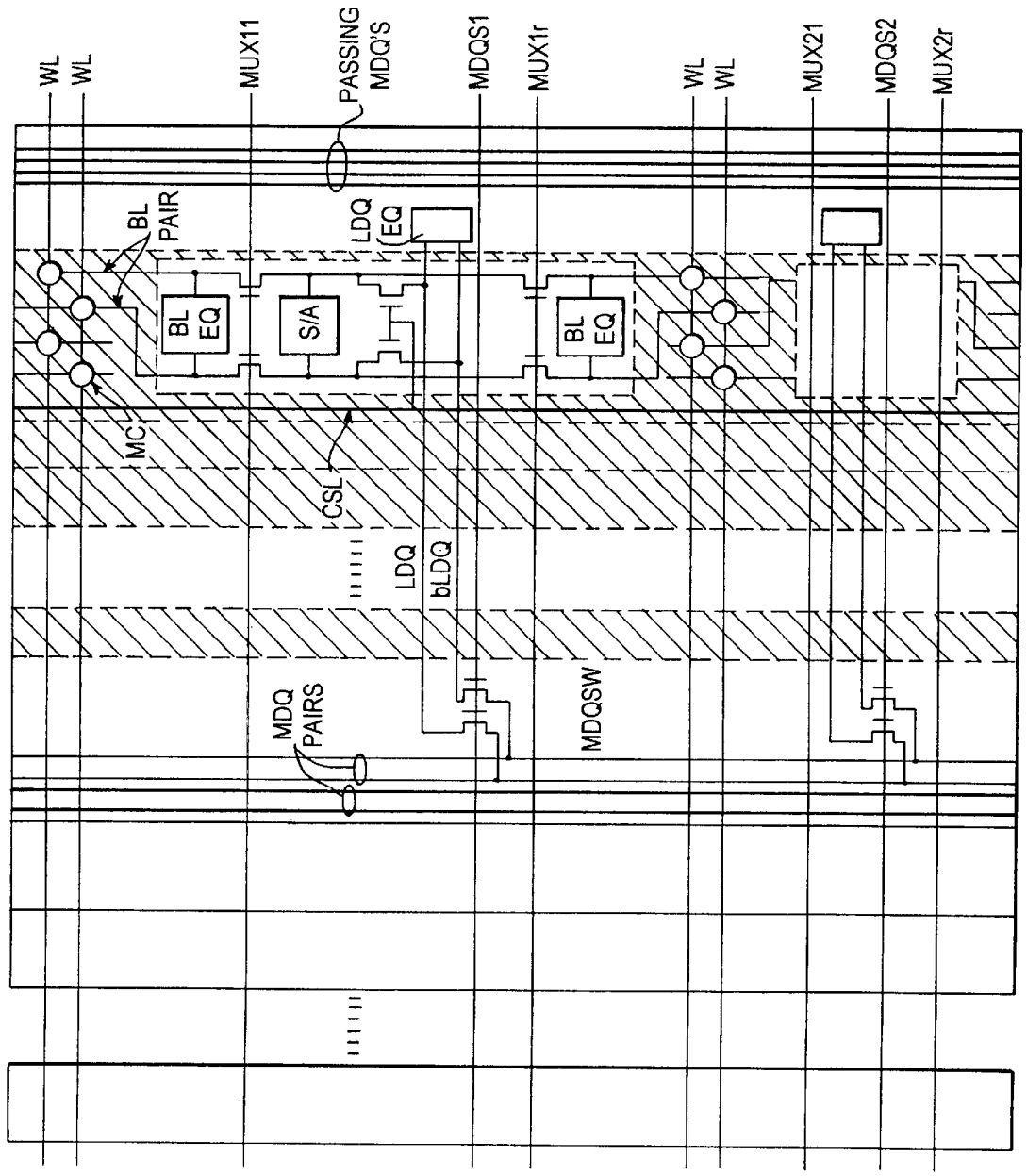
FIG. 9 is a more detailed circuit schematic of the components shown in FIG. 8.

The sense amplifier includes an N-type sense amplifier portion and a P-type sense amplifier portion The N-type sense amplifier portion is controlled by a signal/SAN driven by a first S/A driver 701 and the P-type sense amplifier portion is controlled by a signal SAP driven by a second S/A driver 702. Together, the N- and P-type sense amplifier portions form a latching sense amplifier circuit. The signals latched in the sense amplifier may be transferred to local data line LDQ through column select switch COLSW. Column select switch COLSW is controlled by a column select signal CSL (e.g., a signal corresponding to CSL0 through CSL31 in FIG. 5). The latching sense amplifier is connected to bit line pairs through one of two equalizer/multiplexer (EQ/MU circuits, each disposed adjacent to the N-type sense amplifier portion and the P-type sense amplifier portion, respectively. The multiplexer portion of this circuit may include a pair of switching transistors, each connected in series in each of the two complementary signal lines as shown in FIG. 9. In FIG. 9, a first multiplexer is controlled by signal MUXil and a second multiplexer is controlled by a signal MUXir. In FIG. 9, the bit line equalizer is shown functionally as a block shunting across the two complementary bit lines of a bit line pair. Conventionally, such a bit line equalizer is a single shunting switch transistor or a pair of shunting transistors connected in series to shunt across the wires of the bit line pair.

In FIGS. 8 and 9, Mere are shown two pairs of bit lines connected to respective ones of the two equalizer/multiplexers EQ/MUX. There is also shown two pairs of unconnected bit lines disposed adjacent to the bit line pairs which are connected to the equalizer/multiplexers. Thus, the sense amplifier circuit of FIGS. 8 and 9 is a two sided sense amplifier circuit shared between adjacent cell arrays as described with respect to FIG. 7.

FIG. 9 shows the master bus switches MDQSW coupled to local data bus LDQ. As noted above, sense amplifier SA includes both the N-type and P-type sense amplifier portions and bit line equalize circuit BL EQ typically includes a shunting transistor switch. MOS transistors controlled by signals MUXil and MUXir form the multiplexer that enables the sense amplifier to be shared between two cell arrays. Prior to the transfer of signals, the two complementary wires comprising the local data line are equalized with local data line equalizer LDQ EQ which is arranged in substantially the same manner as the bit line equalizer circuit BL EQ. Master data line switches MDQSW connect the local data lines to the master data lines.

Conventionally, semiconductor memory devices have included word lines formed of a material such as polysilicon, which has a relatively high electrical resistance. An increase in the storage capacity of a DRAM is generally accompanied by an increase in the length of the word lines. This increase in length increases the resistance and parasitic capacitance of the word line, thereby making it difficult to transmit a word line signal from a one end to another at a high speed. One way to overcome this problem is to provide word lines comprising first and second word line portions. Accordingly, the word lines WL of FIG. 9 may each include an upper word line portion 101 formed of a material having a low resistivity (e.g., a metal such as aluminum) arranged in parallel with a lower word line portion 102 which form the gates of the cell transistors. This word line arrangement is shown in the cros-sectional schematic view of FIG. 10B. The upper word line and the lower word line are connected by electrical shunts 103 (or stitches) at a predetermined interval therealong.

Figure 11:
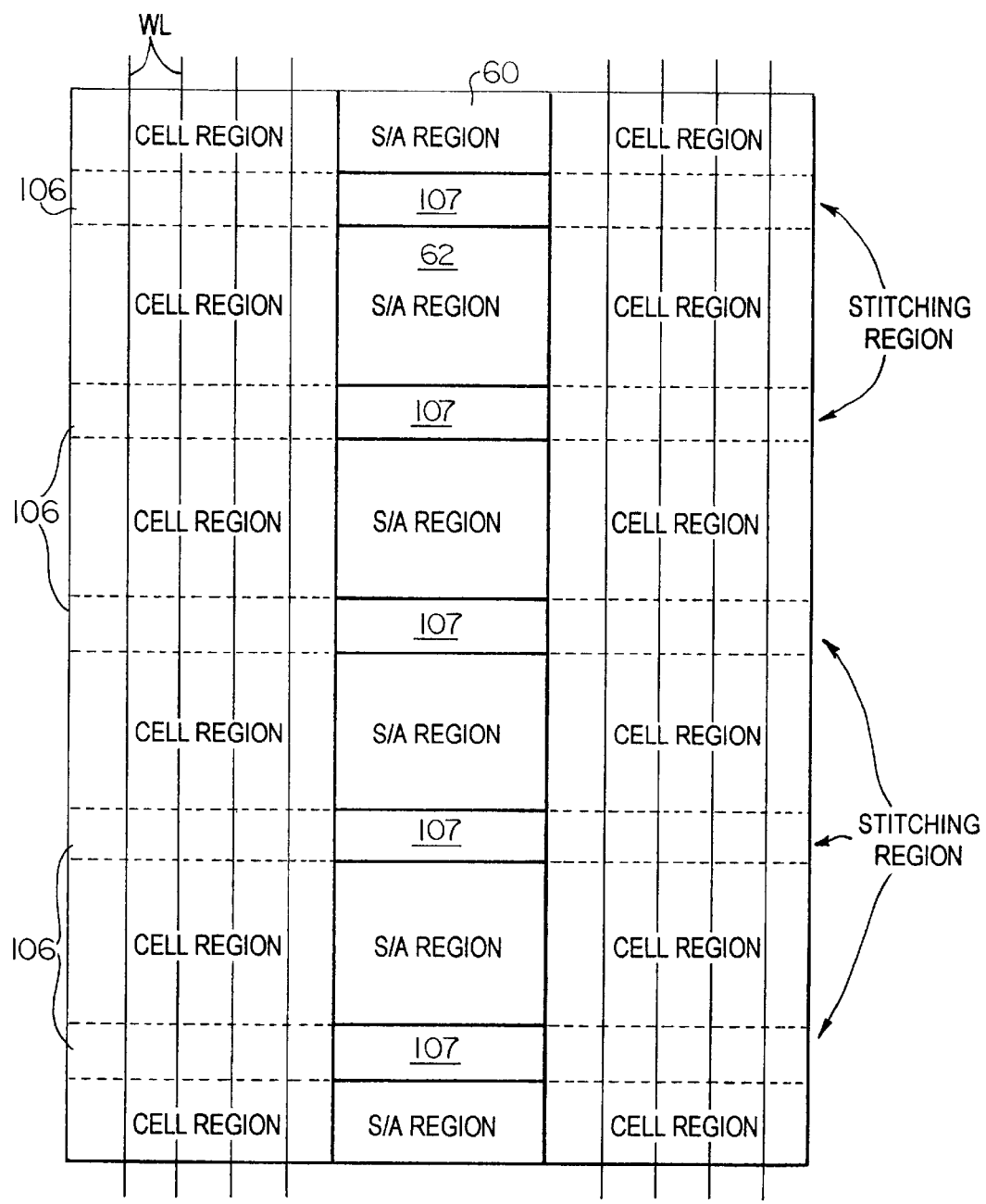
FIG. 11 is a schematic upper plan view showing open spaces in the sense amplifier region.

As indicated in FIG. 10A, the word lines are arranged to extend in a direction substantially perpendicular to and to intersect the bit lines BL. Therefore, shunt regions (or stitch regions) at which upper word line portions and lower word line portions are connected to each other are regions in which no bit lines and memory cells are provided. Thus, spaces 106 are formed in the memory cell array. In the illustrative, but non-limiting, case of a 256 Mbit DRAM, the width of spaces 106 is approximately 2.64 micrometers. Thus, a plurality of sub-arrays which are spaced apart from each other in the word line direction are defined by the spaces 106 as shown in the schematic upper plan view of FIG. 10A. With reference to the schematic upper plan view of FIG. 11, since no bit lines are present in these open spaces in the memory cell array, open spaces 107 are provided in the sense amplifier region and these open spaces in the sense amplifier region can be used to form the switches for connecting the local data lines to the master data lines.

Figure 12:
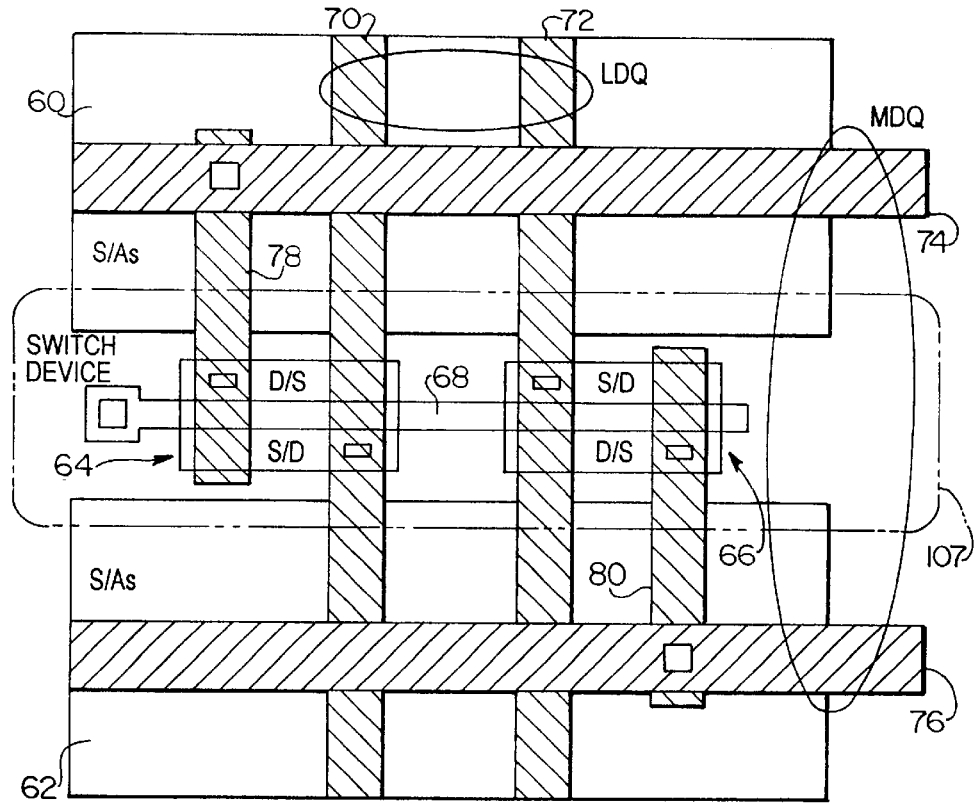
FIG. 12 illustrates the physical arrangement of an MDQSW for selectively connecting the local data line LDQ and the master data line MDQ.

FIG. 12 illustrates the physical arrangement of an MDQSW arranged in open space 107 for selectively connecting the local data line LDQ and the master data line MDQ. The switch device is formed between a first sense amplifier region 60 and a second sense amplifier region 62. The switch device of FIG. 12 includes a first switch transistor 64 and a second switch transistor 66. A gate 68 supplied with a switch control signal is common to the first and second switch transistors. The LDQ line includes a first LDQ wiring 70 and a second LDQ wiring 72. The MDQ line includes a first MDQ wiring 74 and a second MDQ wiring 76. First LDQ wiring 70 is connected to the source/drain (S/D) region of switch transistor 64. A first connector 78 is connected to the drain/source (D/S) region of switch transistor 64 and to the first MDQ wiring 74. Similarly, second LDQ wiring 72 is connected to the source/drain region of switch transistor 66. A second connector 80 is connected to the drain/source region of switch transistor 66 and to the second MDQ wiring 76. When transistors 66 and 68 are turned on by the switch control signal, first LDQ wiring 70 is connected to first MDQ wiring 74 via switch transistor 64 and first connector 78 and second LDQ wiring 72 is connected to second MDQ wiring 76 via switch transistor 66 and second connector 80.

Figure 13:
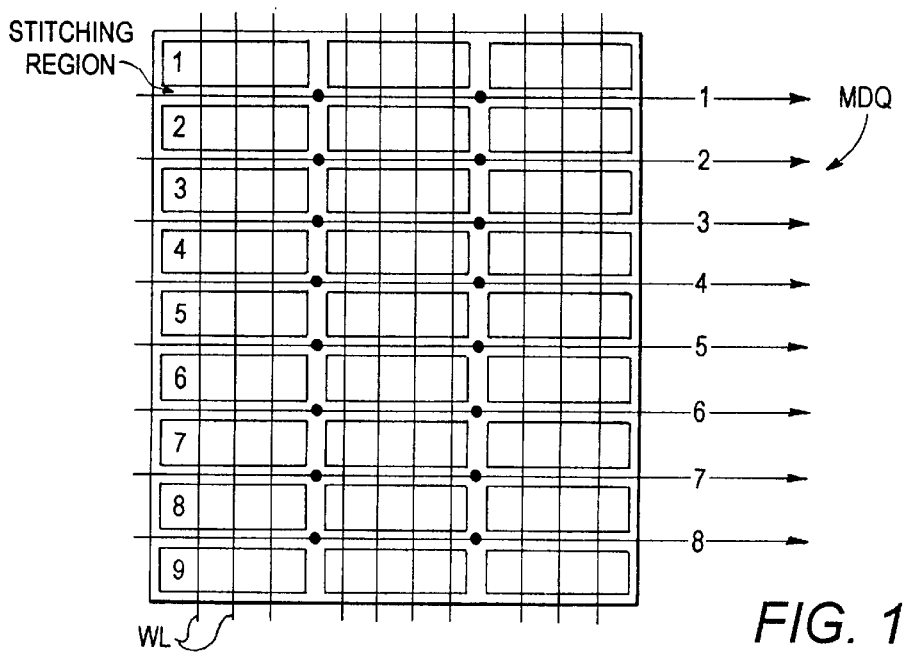
FIG. 13 is an upper plan view showing the division of a memory cell array into an odd number of sub-arrays to pride an even number of stitch regions.

In accordance with the present invention, the memory cell array is divided into an odd number of sub-arrays. As shown in the upper plan view of FIG. 13, by providing an odd number of sub-arrays (9 in the case of FIG. 13), an even number of stitch regions (8 in the case of FIG. 13) may be provided in the spaces between the sub-arrays and thus an even number of master data lines may be conveniently connected to the local data lines. An even number of master data lines is desirable because of the binary nature of semiconductor memory devices. In a particularly convenient arrangement, the memory cell array is divided into $2^n+1$ sub-arrays, where n is equal to or greater than 1. In the arrangement shown in FIG. 13, n is equal to 3. In the case of the one Mbit block shown in FIG. 5, the block may be divided into 33 sub-sections or sub-arrays. In this case, n=5. By dividing the memory cell array into $2^n+1$ sub-arrays, $2^n$ stitch regions may be provided and $2^n$ master data lines can be connected to the local data lines. Since memory device outputs are generally organized in terms of $2^n$, this arrangement is particularly convenient.

Figure 14A:
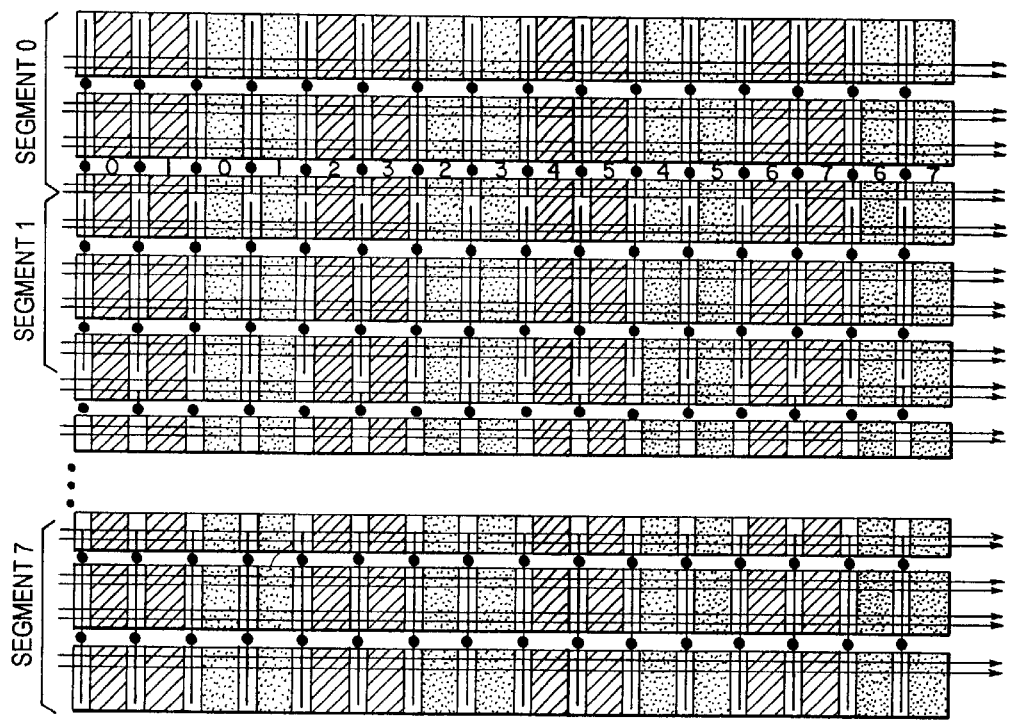
FIGS. 14A–14C illustrate one way in which the 1 Mbit block of FIG. 5 may be divided to provide 32 space for switch devices.
Figure 14C:
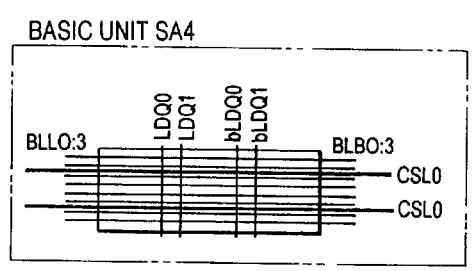
Figure 14B:
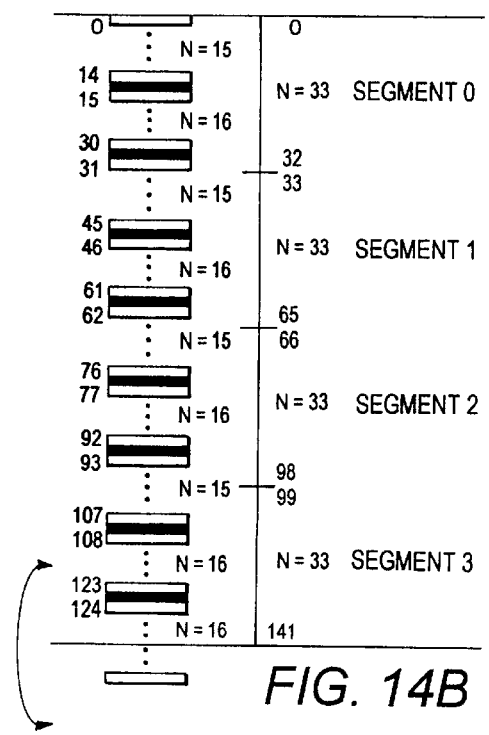

In view of the binary nature of memory devices, the number of columns of memory cells in a memory cell array is an even number and the number is generally equal to a power of 2 (i.e., $2^n$). In order to divide $2^n$ columns into an odd number of sub-arrays, the sizes of at least some of the sub-arrays must be different. FIGS. 14A–14C show one way in which the one Mbit block of FIG. 5 may be divided to provide 32 spaces for switch devices for connecting local data lines to master data lines. As shown by the exploded view of FIG. 14C, the basic unit shown in FIG. 14B corresponds to one of the cell array circuits shown in FIG. 6. As schematically shown in FIG. 14B (in which the 1 Mbit block includes 528 cell array circuits numbered <0>–<527>), spaces are provided between cell array circuits <14> and <15> of Segment 0; between cell array circuits <30> and <31> of Segment 0; between cell array circuits <45> and <46> of Segment 1; between cell array circuits <61> and <62> of Segment 1; between cell array circuits <76> and <77> of Segment 2; between cell array circuits <92> and <93> of Segment 2; between cell array circuits <107> and <108> of Segment 3; and between cell array circuits <123> and <124> of Segment 3. The same pattern (i.e., N=15, N=16, N=15, N=16, N=15, N=16, N=15, N=16, N=16) is repeated for the remaining groups of segments in the 1 Mbit block.

As described above, the number and positioning of the spaces of the semiconductor memory device of the present invention are chosen so that a sufficient number of switches (e.g., for a wide I/O DRAM) may be formed to connect the local data lines to master data lines. For example, by dividing the memory cell array into $2^n+1$ sub-arrays (n is equal to greater than one), a total of $2^n$ spaces are provided between the sub-arrays. Since it is desirable in terms of data input/output to provide $2^n$ master data lines, the present invention provides for a convenient correspondence between the switches formed in the $2^n$ stitch regions and the $2^n$ master data lines.

Of course, other ways of dividing a memory cell array to provide $2^n+1$ sub-arrays may be utilized and the present invention is not limited in this respect. For example, FIG. 15 shows a way of dividing 64 cell array circuits to provide 5 (i.e., $2^2+1$) sub-arrays. In this case, the first sub-array contains 13 cell array circuits; the second, 12 cell array circuits; the third, 14 cell array circuits; the fourth, 12 cell array circuits; and the fifth, 13 cell array circuits. This pattern may be repeated, as needed.

It is not necessary that the upper and lower word line portions of each word line be stitched together at each space between the sub-arrays For example, the upper and lower word line portions of a word line may be stitched together at every second stitch region, every third stitch region, etc. In addition, the stitching regions of adjacent word lines may be offset relative to each other as shown in FIGS. 16A and 16B

The present invention is not limited to memory devices in which a memory cell array is divided into an odd number of arrays and stitches for stitching together upper and lower word line portions are formed in the spaces between the sub-arrays. For example, another technique for minimizing the word line delay uses a local decode/re-driving scheme. In this case, the spaces between the sub-arrays may be utilized for forming the local decoding and re-driving circuitry. Again, since no bit lines are present in these spaces between the sub-arrays, corresponding open spaces are formed in the sense amplifier region and these open spaces in the sense amplifier region can be used to form the switches for connecting the local data lines to the master data lines.

As described above, a memory cell array is divided into an odd number of sub-arrays. In the illustrative, but non-limiting, description provided above, the spaces between the sub-arrays may be utilized to stitch together first and second word line portions. Since no bit lines and memory cells are formed in these spaces between the sub-arrays, corresponding spaces are formed in the sense amplifier layout These spaces may be used to form switches for connecting the local data lines and master data lines. This technique permits a highly integrated semiconductor memory device to be formed. For example, it is estimated that the width of the sense amplifier layout can be reduced by 7% as compared to the sense amplifier layout described in the above-identified U.S. Pat. No. 5,636,158. In addition, since the layout of the present invention does not involve non-linear bit line portions as does the layout of the '158 patent, the layout of the present invention is well-suited for mass production.

While particular embodiments of the present invention have been described and illustrated, it should be understood that the invention is not limited thereto since modifications may be made by persons skilled in the art. The present application contemplates any and all modifications that fall within the spirit and scope of the underlying invention discloses and claimed herein.

I claim:

1. A semiconductor device comprising:
    first and second memory cell regions, each having first and second bit lines and first and second word lines arranged in common the first and second memory cell regions, the first word line being arranged substantially orthogonal to the first and second bit lines and the second word line being arranged above and substantially in parallel to the first word line, a plurality of memory cells being connected to the first and second bit lines and the first word line;

a first contact region which is arranged between the first and second memory cell regions and in which the first word line arranged in common in the first and second memory cell regions is connected to the second word line arranged above and in parallel to the first word line;

third and fourth memory cell regions, each having third and fourth bit lines and third and fourth word lines arranged in common in the third and fourth memory cell regions, the third word line being arranged substantially orthogonal to the third and fourth bit lines and the fourth word line being arranged above and substantially in parallel to the third word line, a plurality of memory cells being connected to the third and fourth bit lines and the third word line;

a second contact region which is arranged between the third and fourth memory cell regions and in which the third word line arranged in common in the third and fourth memory cell regions is connected to the fourth word line arranged above and in parallel to the fourth word line;

first and second sense amplifier regions each having a sense amplifier circuit, the first sense amplifier region being arranged between the first and third memory cell regions and the second sense amplifier region being arranged between the second and fourth memory cell regions;

an open space arranged between the first and second sense amplifier regions and between the first and second contact regions and having a switch circuit;

a first data line arranged in parallel to the first and third word lines and selectively connected to one of the first bit line arranged in the first memory cell region and the third bit line arranged in the third memory cell region; and a second data line arranged orthogonal to the first data line, the second data line being selectively connected to the first data line by the switch circuit formed in the open space.

2. A semiconductor device comprising:

a first memory cell region having a first bit line and first and second word lines, the second word line being arranged above and substantially in parallel to the first word line and the first word line being arranged in a word line direction which is substantially orthogonal to the first bit line;

a second memory cell region having a second bit line and third and fourth word lines, the fourth word line being arranged above and substantially in parallel to the third word line and the third word line being arranged in a direction substantially orthogonal to the second bit line, a plurality of memory cells being connected to the second bit line and the first word line;

a first contact region which is arranged in the first and second word lines direction and adjacent to the first memory cell region and in which the first word line arranged in the first memory cell region being connected to the second word line arranged above and in parallel to the first word line;

a second contact region which is arranged in the third and fourth word lines direction and adjacent to the second memory cell region and in which the third word line arranged in the second memory cell region being connected to the fourth word line arranged above and in parallel to the third word line;

a sense amplifier region having a sense amplifier circuit selectively connected to one of the first and second bit lines, said sense amplifier region being arranged adjacent to the first and second memory cell regions;

an open space arranged between the first and second contact regions and adjacent to the sense amplifier region and having a switch circuit;

a first data line arranged in parallel to the first and third word lines and selectively connected to one of the first bit line arranged in the first memory cell region and the second bit line arranged in the second memory cell region; and a second data line arranged orthogonal to the first data line, said second data line being selectively connected to the first data line by the switch circuit formed in the open space.

* * * * *